(12) United States Patent
Lowell et al.

(10) Patent No.: US 6,362,630 B1
(45) Date of Patent: Mar. 26, 2002

(54) ELECTRONIC TEST TAG FOR WIRELINE CONTINUITY VERIFICATION

(75) Inventors: Alan B. Lowell, Camarillo; Robert B. Walance, Newbury Park, both of CA (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/500,270

(22) Filed: Feb. 8, 2000

(51) Int. Cl.[7] .............................. G01R 27/00; H01P 1/26
(52) U.S. Cl. ...................................... 324/600; 333/22 R
(58) Field of Search ................................ 324/600, 605, 324/713; 333/131, 263, 100, 12, 22 R; 455/454, 248.1, 41; 379/399, 398, 29

(56) References Cited

U.S. PATENT DOCUMENTS 4,859,952 A * 8/1989 Wissell ........................ 324/538
6,097,262 A * 8/2000 Combellack .................. 333/12
6,212,272 B1 * 4/2001 Herschler et al. ............ 379/399

* cited by examiner

Primary Examiner—Safet Metjahic
Assistant Examiner—James Kerveros
(74) Attorney, Agent, or Firm—Allen, Dyer, Doppelt, Milbrath & Gilchrist, P.A.

(57) ABSTRACT

A portable, hand-held 'test tag' device enables a test unit to conduct a wireline connection verification test, in order to determine connectivity of a subscriber metallic wireline pair from a point of access by the test unit to a 'test tag' point of entry location along the metallic wireline pair. The 'test tag' includes a controllable termination circuit and a port coupled to one or more lead connects, that enable a craftsperson to connect the test tag to the metallic wireline pair. The controllable termination circuit includes a prescribed resistance that is configured such that, for a first applied line voltage, the test unit will observe characteristics of the metallic line pair terminated with a low resistance termination, whereas for a second line voltage, the test unit will observe characteristics of the metallic line pair terminated with a high resistance termination.

16 Claims, 2 Drawing Sheets ial data communication services (such as, but not limited to HDSL, ADSL and SDSL), telecommunication service providers are continually seeking ways to optimize utilization of their very substantial existing metallic (e.g., copper) line pairs. Prior to the advent of digital communications, this copper plant was essentially employed for the purpose of carrying nothing more than conventional analog (plain old telephone service or POTS) signals.

ELECTRONIC TEST TAG FOR WIRELINE CONTINUITY VERIFICATION

FIELD OF THE INVENTION

The present invention relates in general to wireline telecommunication systems and test equipment therefor, and is particularly directed to a physically compact, electronic 'test tag' device, that is readily connectable to a metallic wireline pair, such as at a minimum point of entry (at a customer premises) location, and contains circuitry that allows a remote test unit, such as may connected to a test switch matrix at a central office, to apply a prescribed electrical condition to the line. The test tag contains internal circuitry that responds to the applied electrical condition to controllably terminate the line in a selected one of an open loop or closed loop condition for test purposes. When terminating the line by a low valued resistance that closes a loop through the wireline pair, the test tag allows the connectivity of the subscriber line pair to be confirmed all the way from the central office to the test tag bridging location.

BACKGROUND OF THE INVENTION

In the face of the increasing demand for a variety of high speed digital data communication services (such as, but not limited to HDSL, ADSL and SDSL), telecommunication service providers are continually seeking ways to optimize utilization of their very substantial existing metallic (e.g., copper) line pairs. Prior to the advent of digital communications, this copper plant was essentially employed for the purpose of carrying nothing more than conventional analog (plain old telephone service or POTS) signals.

When installing new lines, or when responding to a request by a competitive local exchange carrier (CLEC), such as an internet service provider (ISP), it may be necessary for the incumbent local exchange carrier (ILEC), such as a regional Bell operating company (RBOC), to dispatch a technician to a remote site serving customer premises equipment, for the purpose of verifying continuity of a wireline pair, through which (digital data) service supplied by the CLEC is provided to the customer's data terminal equipment. Unfortunately, because of the wide variety of disparate methods currently employed by the CLEC's and ILEC's for activation and pre-service testing of subscriber line pairs, installation and delivery of service to subscribers is relatively cumbersome and slow.

SUMMARY OF THE INVENTION

In accordance with the present invention, this (digital subscriber) wireline connection verification problem is substantially mitigated by means of a physically compact, electronic 'test tag' device, which is configured to be readily connected to a location along the metallic wireline pair, such as but not limited to a minimum point of entry (MPOE) in the vicinity of customer premises equipment. The test tag contains circuitry that terminates the line in a prescribed resistance state in response to an electrical condition (such as a high or a low DC voltage) applied to the wireline by a remote test device, such as one connected to a test switch matrix at a central office.

In particular, the applied voltage will cause the test tag to selectively terminate the wireline by either a high resistance condition (e.g., on the order of 250 kohms or more—approximating an open circuit), or to bridge the wireline with a very low resistance (e.g., on the order of 200 ohms or less) that approximates an effective short circuit condition.

For each terminated resistance condition the remote test unit may observe the characteristics of the line. Where the tag is placed in the effective short circuit bridging condition, it forms a loop with the two lines of the wireline pair, so that the test unit may confirm connectivity from the central office to the tag location.

The internal wireline termination circuitry of the test tag may comprise a pair of line-coupling terminals, that are bridged by a relatively high valued resistance, and by a voltage and current detector-controlled switch, that is coupled in circuit with a relative low valued resistor. This internal wireline termination circuitry is retained in a compact (e.g., palm-sized) housing or casing, and has its line-coupling terminals adapted to be connected to diverse types of lead terminations, such as free-ended wire 'pigtails', an RJ-11 plug, a type 66 block clip, and the like, that extend externally of the test tag casing, so as to enable a craftsperson to physically connect the test tag to the wireline.

In an alternative configuration, the internal wireline termination circuitry of the test tag may comprise a commercially available maintenance test unit (MTU), that is retained in the test tag casing, and has a pair of network side or test source ports and a pair of subscriber drop ports. The network ports may be connected to diverse types of lead terminations, such as free-ended wire 'pigtails', an RJ-11 plug, a type 66 block clip, and the like, extending externally of the test tag casing, so as enable a craftsperson to connect the test tag to the wireline. The subscriber drop ports are bridged internally of the test tag's case by means of a relatively low resistance.

The test tag may be used when installing a new line or to troubleshoot existing cable plant. For a new installation, an ILEC cable plant installer connects a test tag to a network demarcation point of a newly installed unbundled wireline pair at a prescribed location (e.g., MPOE) near the subscriber premises. For troubleshooting an existing cable plant, the technician connects the tag to the wireline pair of interest, to allow remote verification testing. Once so connected, the test tag terminates the line with a circuit that allows a remote site to apply a selected high or low voltage to the line and thereby place the tag in a prescribed resistance state, as described above, so that connectivity of the wireline may be verified. Once the line has been verified, the installer removes the tag and connects the line to a subscriber drop for the CPE.

DETAILED DESCRIPTION

Figure 1:
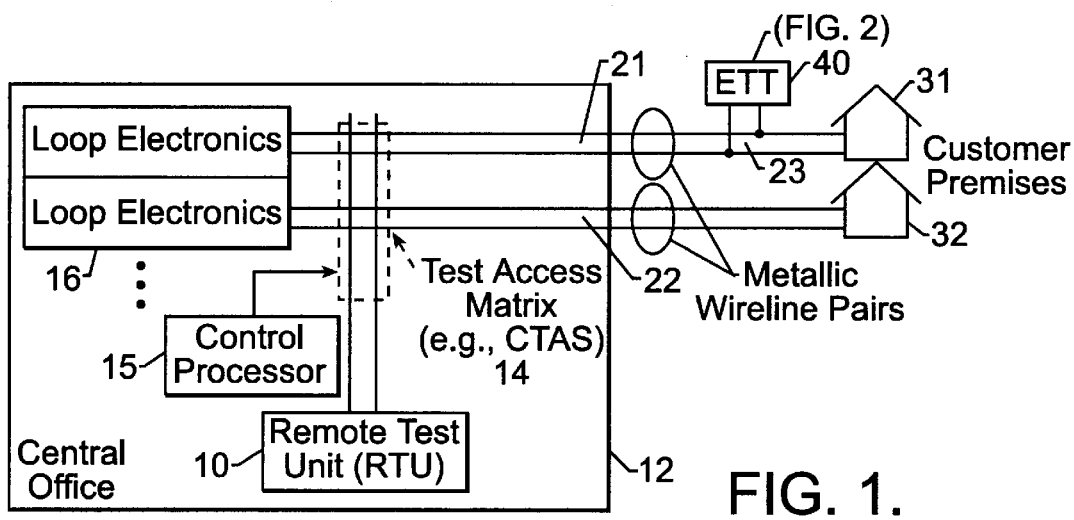
FIG. 1 is a reduced complexity network diagram showing metallic wireline pairs that extend from a central office to customer premises, and the connection of the electronic test tag of the invention to a respective metallic wireline pair.

Before detailing the wireline verification electronic 'test tag' of the invention, it should be observed that the invention resides primarily in a prescribed combination of conventional communication circuitry and packaging hardware therefor, that enable the tag to be both physically and electrically interfaced with a metallic wireline pair, to allow a remote test unit to communicate with the internal circuitry of the test tag and test the line. Consequently, the configuration of such components and the manner in which they may be interfaced with a metallic (e.g., copper) wireline communication link have, for the most part, been shown in the drawings by readily understandable block diagram illustrations, which show only those specific details that are pertinent to the present invention, so as not to obscure the disclosure with details which will be readily apparent to those skilled in the art having the benefit of the description herein. Thus, the Figures are primarily intended to show major components and functional modules of a telecommunication system in convenient functional groupings, so that the present invention may be more readily understood.

Attention is now directed to FIG. 1, wherein a reduced complexity embodiment of a metallic wireline communication network is diagrammatically shown as comprising a processor-controlled test head or remote test unit (RTU) 10, such as may be installed in an ILEC's central office facility 12, or as part of test signal generation and processing circuitry of a portable craftsperson's test set. The RTU 10 may contain any of a variety of commercially available test devices employed in the industry used to conduct wideband electrical measurements on a selected line under test.

The test unit 10 is connected to a CTAS interconnect matrix switch 14, which contains a plurality of programmable (test-accessible) cross-points that are controllably operative to interconnect one or more high data rate digital data traffic channels (e.g., ADSL, HDSL and SDSL channels) supplied by subscriber loop electronics 16 with selected wireline pairs, two of which are shown at 21 and 22, serving telecommunication equipment installed at remote customer premises 31 and 32, respectively. In a typical central office installation, some number of the wireline connection points of the CTAS matrix switch 14 may be coupled via a main distribution frame (not shown) for CLEC leased (copper) wirelines used for the subscriber loop 'drops' 21, 22.

Connectivity through the CTAS interconnect matrix switch 14 is controlled by way of a programmable control processor 15, that may be downloaded with communication and test control software from the test unit 10 in association with one or more CLECs served by the ILEC's central office equipment. Under processor control, the CTAS matrix switch 14 is operative to source one or more test signals for stimulating a selected one of the copper pairs 21, 22 under test, and to conduct an analysis of the wireline pair's response, when bridged at some location, shown at 23 for wireline pair 21, by an electronic test tag (ETT) 40 of the invention. As a non-limiting example, the tag attachment location of the wireline pair of interest (e.g., wireline pair 21) may be a minimum point of entry 23 at or in proximity to customer premises equipment 31.

As described briefly above, the electronic test tag-configured line termination device of the invention contains circuitry that allows a remote test device to apply prescribed conditions to the wireline pair, such as respectively high and low DC voltages, that are effective to selectively terminate the wireline pair by either a high resistance that serves to simulate an open circuit condition, on the one hand, or to bridge the wireline with a relatively low resistance short to allow remote continuity confirmation, on the other hand.

Figure 2:
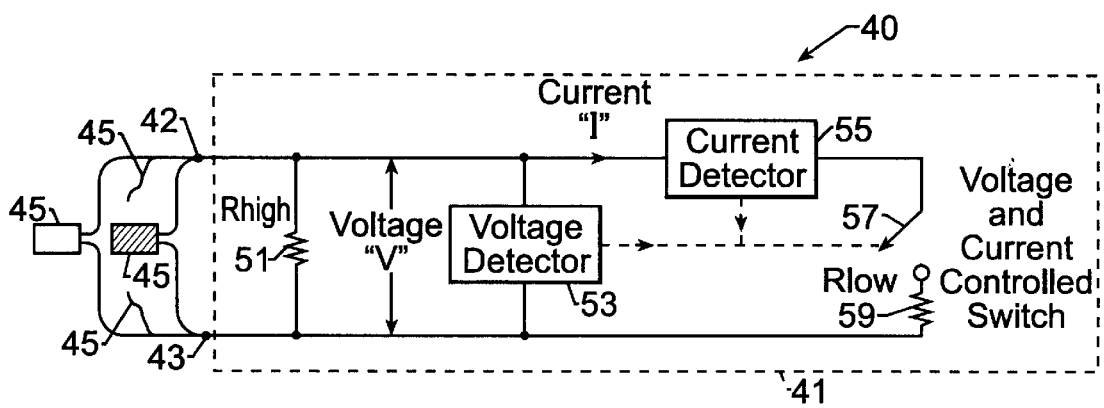
FIG. 2 diagrammatically illustrates a 'test tag'-configured line termination device of the present invention.

FIG. 2 diagrammatically shows the internal circuitry of the electronic test tag 40 as preferably being retained in a compact (e.g., palm-sized) housing or casing, shown by broken lines 41, and having a pair of wireline connection ports 42 and 43. The wireline connection ports may be connected to diversely configured lead terminations 45, such as, but not limited to free-ended wire 'pigtails', an RJ-11 plug, a type 66 block clip, and the like, that extend externally of the test tag casing 41, and facilitate a craftsperson connecting the test tag to the wireline.

Ports 42 and 43 are bridged by a relatively high valued resistance 51, which may have a resistance on the order of 250 Kohms or greater. Ports 42 and 43 are also bridged by a voltage detector 53, and are coupled in circuit with a series current flow path through a current detector 55, a current detector responsive switch 57 and a relatively low valued resistance 59. Resistance 59 has a very low resistance (e.g., on the order of 200 ohms or less) that is used to bridge the line with an effective short circuit condition, when the switch 57 is closed, so that it forms a loop with the two lines of the wireline pair, and allows the test unit to confirm connectivity from the central office to the tag.

Figure 3:
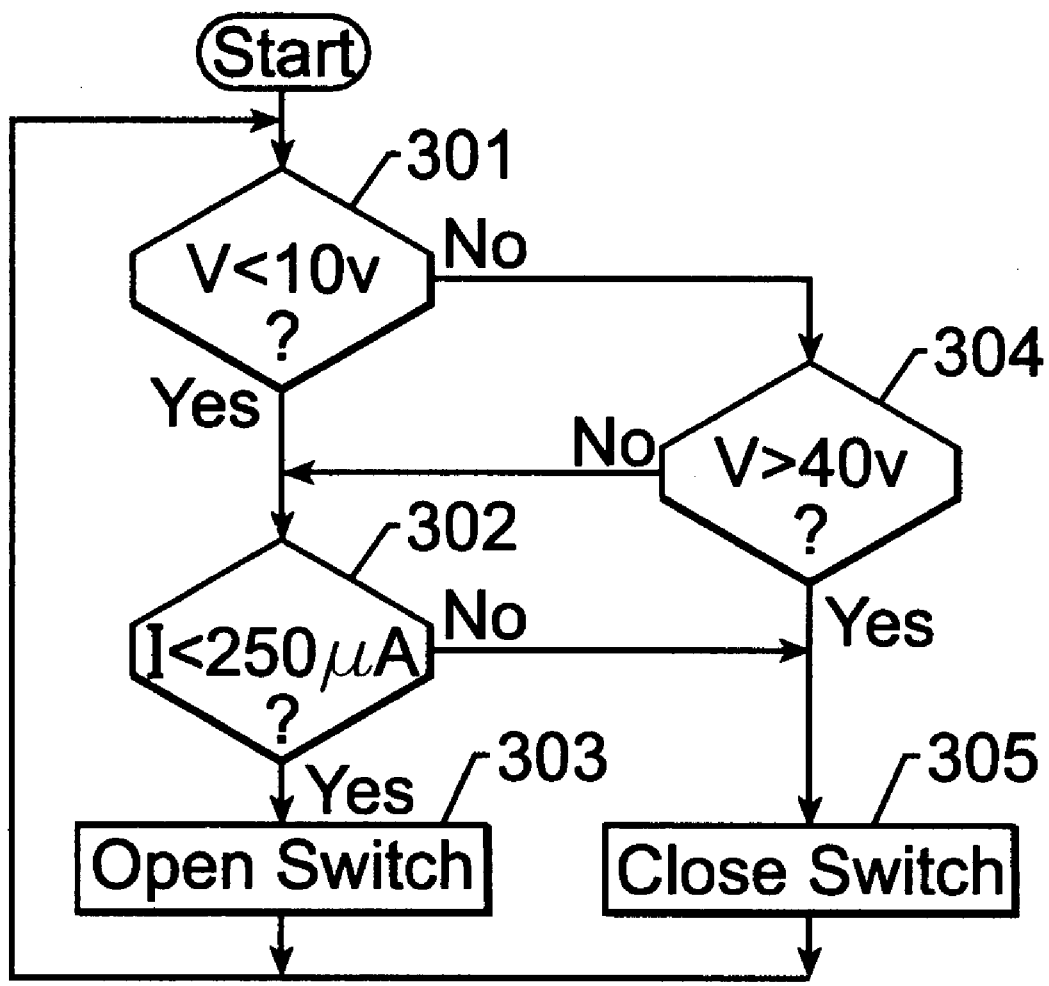
FIG. 3 is a flow chart associated with the operation of the electronic test tag of the invention.

Operation of the electronic test tag of the invention may be readily understood by reference to the flow chart of FIG. 3. It will be assumed that a line-installing or servicing technician has previously made an electrical connection of one of the test tag's external lead terminations 45 to the wireline pair under test, for example at location 23 near the subscriber premises 31, as shown in FIG. 1. Once so connected, the electronic test tag effectively terminates the line with an internal circuit that is remotely controllable from the central office. In this condition, either the CLEC or ILEC may perform automated testing of the wireline.

As pointed out above the tag's internal circuitry is operative to present a controlled termination resistance condition to the wireline pair in accordance with an input stimulus applied to its network side ports 42 and 43. In the present example, at query step 301 a determination is made as to whether a (tag-conditioning) voltage associated with an open circuit condition is applied to ports 42 and 43 of the wireline pair. As described above, the remote test unit may apply a low DC voltage, that is effective to terminate the wireline pair by a high valued resistance (at least 250 Kohms) to simulate an open circuit condition, or a high DC voltage that is effective to terminate the wireline pair by a very low valued resistance (200 ohms or less) and simulate a shorted loop condition.

In particular, if the voltage applied to ports 42 and gun 43 is less than a relatively low voltage threshold (e.g., 10 volts), the routine steps to query step 302, to determine whether more than a prescribed minimum threshold current (e.g., 250 microamps) is flowing through the wireline. If the answer to query step 302 is YES (the current is less than the threshold—zero through detector 55 with switch 57 open), switch 57 is retained in its open condition at step 303. In this state, the line is bridged by only the relatively high valued resistance of resistor 51. If the answer to query step 302 is NO (the current through detector 55 is above the threshold), the routine transitions to step 305, wherein switch 57 is closed. This causes the wireline to be bridged by the relatively low valued resistance of resistor 59, and thereby effectively loop the wireline pair through the closed switch 57 and the low valued resistance 59.

If the answer to query step 301 is NO (namely, the voltage applied to ports 42 and 43 is greater than the relatively low voltage threshold (10 volts)), the routine steps to query step 304, to determine whether more than a prescribed upper threshold voltage (e.g., 40 volts) is applied across ports 42 and 43. If the answer to query step 304 is NO, the routine branches to query step 302, described above. However, if the answer to query step 304 is YES (the voltage detected by voltage detector 53 is greater than the upper voltage threshold, the routine transitions to step 305, wherein switch 57 is closed. As noted above, closing switch 57 causes the line to be bridged by the relatively low valued resistance of resistor 59, and thereby effectively provide a closed wireline loop therethrough.

As noted above, in an alternative configuration, the internal wireline termination circuitry of the electronic test tag may comprise a commercially available maintenance test unit (MTU), manufactured by Lucent Technologies, that provides a readily available component used in the communications test industry for a variety of functions, and possesses the controllable port (resistance) termination functionality of the invention. An MTU has a pair of network side or test source ports and a pair of subscriber drop ports. The network ports of the MTU may be connected to ports 42 and 43, so as enable a craftsperson to connect the MTU tag to the wireline. The subscriber drop ports may be shorted together internally of the tag casing. The MTU may then be controlled in the manner described above and shown in the flow chart of FIG. 3.

As will be appreciated from the foregoing, the line continuity verification problem described above, is successfully addressed by the physically compact electronic test tag of the present invention, which is readily connected to a metallic wireline serving customer premises equipment. The test tag allows a remote unit to selectively apply a voltage that will cause the test tag to terminate the wireline by either a high resistance condition (e.g., on the order of 250 kohms or more—approximating an open circuit), or to bridge the wireline with a very low resistance (e.g., on the order of 200 ohms or less) that approximates an effective short circuit condition. For each terminated resistance condition the remote test unit may observe the characteristics of the line. Where the tag is placed in the effective short circuit bridging condition, it forms a loop with the two lines of the wireline pair, so that the test unit may confirm connectivity from the central office to the tag location.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A portable, hand-held device for enabling a test unit to conduct a wireline connection verification test, and thereby determine connectivity of a subscriber metallic wireline pair from a point of access by said test unit to an access location along said metallic wireline pair, said device comprising a controllable termination circuit having a prescribed resistance termination and a port connected to one or more lead connections, so as to enable a craftsperson to connect said controllable termination circuit to said metallic wireline pair.

2. A portable, hand-held device according to claim 1, wherein said prescribed resistance termination is configured such that, for a first line voltage, said test unit will observe characteristics of said metallic line pair terminated with a low resistance termination, whereas for a second line voltage, said test unit will observe characteristics of said metallic line pair terminated with a high resistance termination.

3. A portable, hand-held device according to claim 1, wherein said prescribed resistance termination is configured such that, for a first line voltage greater than a first magnitude, said test unit will observe characteristics of said metallic line pair terminated with a low resistance termination, whereas for a line voltage less than a second magnitude lower than said first magnitude, said test unit will observe characteristics of said metallic line pair terminated with a high resistance termination.

4. A portable, hand-held device according to claim 3, wherein said high resistance termination comprises a resistance of a value on the order of 250 Kohms or greater, and said low resistance termination comprises an electrical short.

5. A portable, hand-held device according to claim 4, wherein said plurality of diverse types of lead connections include at least one of free-ended wires, an RJ-11 plug, and a type 66 block clip.

6. A portable, hand-held device according to claim 1, wherein said controllable termination circuit includes a high magnitude resistance of a value on the order of 250 Kohms or greater, and a low magnitude resistance on the order of 200 ohms or less, approximating an electrical short, such that, for a line voltage above 40 volts, said test unit will observe characteristics of said metallic line pair terminated by an effective electrical resistance of 200 ohms or less, whereas for a line voltage less than 10 volts, said test unit will observe characteristics of said metallic line pair terminated by a resistance on the order of 250 Kohms or greater associated with an open circuit condition.

7. A method of enabling a test unit to conduct a wireline connection verification test, and thereby determine connectivity of a subscriber metallic wireline pair from said test unit to an access location along said metallic wireline pair, said method comprising the steps of:

(a) providing a wireline terminating device having a controllable termination circuit, said controllable termination circuit including a prescribed resistance termination and adapted to be electrically and physically terminated by one or more lead connections;

(b) connecting said lead connections to a point of entry location along said metallic wireline pair serving customer premises equipment; and (c) applying a voltage to said wireline pair from a test unit that is connected to a point of access of said wireline pair remote with respect to said point of entry location, such that for a first line voltage, said test unit will observe characteristics of said metallic line pair terminated with a low resistance termination, whereas for a second line voltage, said test unit will observe characteristics of said line terminated with a high resistance termination.

8. A method according to claim 7, wherein said prescribed resistance termination is configured such that, in step (c), for an applied line voltage greater than a first magnitude, said test unit will observe characteristics of said metallic wireline pair terminated with said low resistance termination, whereas for a line voltage less than a second magnitude lower than said first magnitude, said test unit will observe characteristics of said metallic wireline pair terminated with said high resistance termination.

9. A method according to claim 7, wherein said high resistance termination comprises a resistance of a value on the order of 250 Kohms or greater, and said low resistance termination comprises an electrical short.

10. A method according to claim 7, wherein said plurality of diverse types of lead connections include at least one of free-ended wires, an RJ-11 plug, and a type 66 block clip.

11. A method according to claim 10, wherein said controllable termination circuit includes a high magnitude resistance of a value on the order of 250 Kohms or greater, and a low magnitude resistance on the order of 200 ohms or less, approximating an electrical short, such that, in step (c), for a line voltage above 40 volts, said test unit will observe characteristics of said metallic line pair terminated by an effective electrical resistance of 200 ohms or less, whereas for a line voltage less than 10 volts, said test unit will observe characteristics of said metallic line pair terminated by a resistance on the order of 250 Kohms or greater associated with an open circuit condition.

12. A method of providing telecommunication service to a customer premises comprising the steps of:

(a) installing a wireline communication link from an upstream service provider-associated location to a downstream location in the vicinity of said customer premises;

(b) at said downstream location, attaching said wireline communication link to wireline connection leads of a tag device containing a controllable termination circuit, said controllable termination circuit including a prescribed resistance termination and adapted to be electrically and physically terminated by one or more lead connections;

(c) applying a voltage to said wireline communication link from a test unit that is connected to a point of access of said wireline communication link remote with respect to said downstream location, such that, for a first applied voltage, said test unit will observe characteristics of said wireline communication link terminated with a low resistance termination, and for a second applied voltage, said test unit will observe characteristics of said wireline communication link terminated with a high resistance termination; and (d) in response to verifying connectivity of said wireline communication link from said upstream service provider-associated location to said downstream location, removing said tag and providing a wireline connection therefrom to said customer premises.

13. A method according to claim 12, wherein said high resistance termination comprises a resistance of a value on the order of 250 Kohms or greater, and said low resistance termination comprises an electrical short.

14. A method according to claim 12, wherein said plurality of diverse types of lead connections include at least one of free-ended wires, an RJ-11 plug, and a type 66 block clip.

15. A method according to claim 12, wherein said prescribed resistance termination is configured such that, in step (c), for an applied line voltage greater than a first magnitude, said test unit will observe characteristics of said metallic wireline pair terminated with a low resistance termination, whereas for a line voltage less than a second magnitude lower than said first magnitude, said test unit will observe characteristics of said metallic wireline pair terminated with a high resistance termination.

16. A method according to claim 12, wherein said controllable termination circuit includes a high magnitude resistance of a value on the order of 250 Kohms or greater, and a low magnitude resistance on the order of 200 ohms or less, approximating an electrical short, such that, in step (c), for a line voltage above 40 volts, said test unit will observe characteristics of said metallic line pair terminated by an effective electrical resistance of 200 ohms or less, whereas for a line voltage less than 10 volts, said test unit will observe characteristics of said metallic line pair terminated by a resistance on the order of 250 Kohms or greater associated with an open circuit condition.

* * * * *